United States Patent [19]

Miyake et al.

[11] Patent Number: 5,525,813
[45] Date of Patent: Jun. 11, 1996

[54] IMAGE SENSOR HAVING TFT GATE ELECTRODE SURROUNDING THE PHOTOELECTRIC CONVERSION ELEMENT

[75] Inventors: Hiroyuki Miyake; Kazuhiro Sakai, both of Kanagawa, Japan

[73] Assignee: Fuji Xerox Co., Ltd., Tokyo, Japan

[21] Appl. No.: 378,940

[22] Filed: Jan. 26, 1995

Related U.S. Application Data

[63] Continuation of Ser. No. 870,325, Apr. 17, 1992, abandoned.

[30] Foreign Application Priority Data

Apr. 19, 1991 [JP] Japan ................................. 3-119575

[51] Int. Cl.$^6$ ...................... H01L 29/04; H01L 31/036; H01L 31/0376; H01L 31/20
[52] U.S. Cl. .................... 257/59; 257/292; 257/444; 257/448; 257/440; 257/294; 250/208.1
[58] Field of Search ................... 257/292, 53, 59, 257/347, 448, 444, 294, 72, 443, 293, 440; 250/208.1

[56] References Cited

U.S. PATENT DOCUMENTS

| | | | |
|---|---|---|---|
| 4,041,519 | 8/1977 | Melen | 257/292 |
| 4,471,371 | 9/1984 | Hamano | 257/53 |
| 4,694,317 | 9/1987 | Higashi et al. | 257/53 |
| 4,845,375 | 7/1989 | Tsushima | 257/77 |
| 4,889,983 | 12/1989 | Numano et al. | 257/292 |
| 4,979,007 | 12/1990 | Ogawa et al. | 257/448 |
| 5,070,236 | 12/1991 | Miyake | 250/208.1 |
| 5,187,563 | 2/1993 | Yamazaki | 257/53 |
| 5,202,575 | 4/1993 | Sakai | 257/294 |
| 5,204,519 | 4/1993 | Nishihara et al. | 250/208.1 |

FOREIGN PATENT DOCUMENTS

| | | | |
|---|---|---|---|
| 61-147573 | 7/1986 | Japan | 257/59 |
| 92/06502 | 4/1994 | WIPO | 257/292 |

*Primary Examiner*—Jerome Jackson, Jr.
*Assistant Examiner*—John Guay
*Attorney, Agent, or Firm*—Finnegan, Henderson, Farabow, Garrett & Dunner

[57] ABSTRACT

An image sensor is reduced in size by combining a photoelectric conversion element with a transfer element thin film transistor (TFT). The photoelectric conversion element comprises a lamination including a metal electrode, a photoconductive layer and a transparent electrode. The TFT transfer element comprises a gate electrode, a drain electrode and a source electrode. In the image sensor, the metal electrode of the photoelectric conversion element also serves as the drain electrode of the TFT. In addition, the gate electrode is formed around the photoelectric conversion element, and the source electrode is formed around the gate electrode.

6 Claims, 6 Drawing Sheets

IMAGE SENSOR HAVING TFT GATE ELECTRODE SURROUNDING THE PHOTOELECTRIC CONVERSION ELEMENT

This application is a continuation of application Ser. No. 07/870,325, filed Apr. 17, 1992, now abandoned.

BACKGROUND OF THE INVENTION

This invention relates to an image sensor, and more particularly, an image sensor used for facsimile machines or the like.

FIELD OF THE INVENTION

Image sensors, such as contact type image sensors, are well-known which convert image data of documents or the like, which have been projected onto the image sensor through 1:1 focusing optics, into electrical signals (Japanese Patent Laid Open No. Sho. 63-9358). The projected image is divided into a large number of picture elements, each of which corresponds to a particular photoelectric conversion element. Electric charges generated in a given block of photoelectric conversion elements are transferred to and stored in line capacitances by the action of thin-film transistor transferring elements (TFTs). The electrical charges are then time-sequentially read out in the form of electrical signals at a speed of the order of 100 KHz to the order of 1 MHz. This type of image scanner is called a TFT-actuated image sensor.

The action of the TFT allows a TFT-actuated image sensor to read an image with a single drive integrated circuit (IC) so that the number of drive ICs required for driving the image sensor can be reduced.

The TFT-actuated image sensor, whose equivalent circuit diagram is shown in FIG. 6, includes a linear photoelectric conversion element array 32, the length of which is substantially the width of a document. A charge transfer section 41 is provided which includes a plurality of TFTs Ti,j (i=1 to N, j=1 to n), each of which is associated with a photoelectric conversion element 31 in a one-to-one correspondence. The TFT-actuated image sensor further includes a matrix-formed wiring section 43.

The photoelectric conversion element array 32 is divided into N number of blocks of photoelectric conversion element groups. Each group consists of "n" number of photoelectric conversion elements 31 which may be equivalently expressed as photodiodes Pi,j (i=1 to N, j=1 to n). Photoelectric conversion elements 31 are correspondingly connected to drain electrodes 24 of TFTs Ti,j. Source electrodes 23 of TFTs Ti,j of each block, are respectively connected to "n" number of common signal lines 44 through matrix-formed wiring section 43. Common signal lines 44 are connected to drive IC 45.

Gate electrodes 21 of TFTs Ti,j are connected to a gate pulse generating circuit 46 to turn on the TFTs in a given block. The electric charges generated in photoelectric conversion elements 31 are stored for a predetermined period of time in the parasitic capacitance of the photoelectric conversion elements (i.e., a diode capacitance) and in the drain/gate overlap capacitance associated with each of the TFTs. The electric charges generated by a given block of photoelectric conversion elements 31 are transferred to and stored in corresponding line capacitances Ci (i=1 to n) of wiring section 43 by the action of the TFTs. Each block is sequentially activated, by simultaneously applying a gate pulse to all gates 21 of the TFTs in the activated block, to transfer the electric charges generated therefrom to line capacitances Ci.

Specifically, a gate pulse G01 is transmitted, on line G1, from gate pulse generating circuit 46 to TFTs T1,1 to T1,n in the first block to cause those TFTs to turn ON. The electric charges generated and stored in photoelectric conversion elements 31 of the first block are transferred to and stored in line capacitances Ci. The electric charges stored in line capacitances Ci change the potentials of the common signal lines 44. These electric potentials are sequentially output on line 47 by successively turning ON analog switches SWi (i=1 to n) in drive IC 45.

In a similar manner, TFTs T2,1 to T2,n in the second block through TN,1 to TN,n in the N-th block are turned on in response to respective gate pulses $\phi$G2 through $\phi$Gn. The electric charges in the photoelectric conversion elements are transferred and read out block by block, thereby obtaining image signals reflecting one line in the fast scanning direction of the document. The document original is then moved by means of a document feed means (not shown) such as a roller. These operations, as mentioned above, are repeated, to obtain image signals characteristic of the whole document.

The construction of the photoelectric conversion element and the TFT in the above conventional image sensor will be described with reference to FIGS. 7 and 8. FIG. 7 shows a plan view of a photoelectric conversion element and a TFT and FIG. 8 shows a cross-sectional view taken along line 8—8 in FIG. 7.

As shown in FIGS. 7 and 8, each conventional photoelectric conversion element has a layered or sandwich-type structure, in which a lower metal electrode 16 made of chromium (Cr), for example, having a linear shape serves as a common electrode for photoelectric conversion elements 31 which are aligned in the fast scanning direction. Photoconductive layer 17 is made of amorphous silicon hydride (a-Si:H) and is provided for each photoelectric conversion element 31 (each bit). Photoconductive layer 17 does not extend between adjacent photoelectric conversion elements 31. An upper transparent electrode 18, made of indium tin oxide (ITO), similarly does not extend between adjacent photoconversion elements 31. These layers are successively laminated on insulating substrate 11 made of glass, ceramic or the like.

Lower metal electrode 16 is elongated in the fast scanning direction. Photoconductive layer 17 is divided, such that adjacent portions of photoconductive layer 17 are spaced from one another, and extends in the fast scanning direction. Upper transparent electrode 18 is similarly divided and adjacent portions thereof are spaced from one another to form individual electrodes. Portions interposing the photoconductive layer 17 between the metal electrode 16, applying a constant voltage VB, and the transparent electrode 18 are juxtaposed to form the photoelectric conversion element array 32.

On the other hand, each TFT incorporated in the above conventional image sensor has an inverted staggered structure as shown in FIG. 7 and 8, in which a chromium (Cr1) layer serves as a gate electrode 21, a silicon nitride (SiNx) film serves as gate insulating film 22, an amorphous silicon hydride (a-Si:H) layer as semiconductor active layer 12, a silicon nitride (SiNx) layer as channel protecting layer 14, an n+ amorphous silicon hydride (n+ a-Si:H) layer serves ohmic contact layer 13, a chromium (Cr2) layer serves as both drain electrode 24 and source electrode 23, an insulation layer 25 made of polyimid, for example, and an aluminum layer 19' which shields the a-Si:H layer from light. Aluminum layer 19' is formed only above channel protecting layer 14. Each of the above layers that form the TFTs are successively laminated on substrate 11.

Light-shielding aluminum layer 19' is employed to prevent light from exposing the a-Si:H layer through the channel protecting layer and causing a photoelectric effect to occur in the a-Si:H layer. Drain electrode 24 is connected to wiring layer 26a which extends from transparent electrode 18 in photoelectric conversion element 31. Ohmic contact layer 13 is divided into two portions, one of which contacts drain electrode 24 and the other contacts source electrode 23. The Cr2 layer of both drain electrode 24 and source electrode 23 coats both portions of ohmic contact layer 13, respectively. The Cr2 layer is employed to assure stability of n+ a-Si:H ohmic contact layer 13 by protecting this layer from damage resulting from vapor deposition or sputtering.

In the above conventional TFT-actuated image sensor, however, a large area insulating substrate 11 made of glass, ceramic or the like is subjected to patterning by photolithography and etching processes to make the photosensing elements. Accordingly, the TFTs should have large dimensions. For example, gate lengths (L) are patterned to be greater than 10 μm to 20 μm in order to assure accurate pattern matching. In addition, the photoelectric conversion elements should be independently spaced from the TFTs, as shown in FIG. 7. Consequently, since the space between conversion element arrays and TFTs cannot be reduced, it is difficult to reduce the size of the overall image sensor body.

In addition, due to low mobility of charge-carriers in semiconductor active layer 12 (channel layer of the TFT), the gate width (W) of the TFT should be 5 to 20 times longer than the gate length (L) of the TFT in order to lower the electrical resistance of the a-Si:H active layer 12, thereby increasing the charge transfer speed of the TFT. Accordingly, when a plurality of the photoelectric conversion element arrays are aligned in the slow scanning direction to form a color image sensor, for example, it is difficult to achieve a high density of devices in the photosensing section (which includes a plurality of photoelectric conversion element arrays 31). Therefore, a large and complicated image memory is required. Moreover, the relatively long gate length of the TFTs also makes it difficult to reduce the overall size of the image sensor.

SUMMARY OF THE INVENTION

The present invention has been developed to overcome the above problems associated with conventional TFT actuated image sensors. This invention relates to an image sensor which is reduced in size by integrating photosensing elements consisting of a photoelectric conversion element combined with a thin-film transistor transferring element, in such a way that the thin-film transistor transferring elements are formed around and at the edge of the photoelectric conversion element.

An object of this invention is to provide an image sensor reduced in size by combining photoelectric conversion elements and TFT transferring elements in an integrated form (TFT-combined photoelectric conversion elements) in which the metal electrodes serve both as individual electrodes for the photoelectric conversion elements and as drain electrodes for the TFT transferring elements. In addition, each TFT transferring element is formed around the photoelectric conversion element.

To achieve the above object, an image sensor according to this invention comprises a photoelectric conversion element comprising, a lamination including a metal electrode, a photoconductive layer and a transparent electrode; and a TFT transferring element is also provided which includes a gate electrode, a drain electrode and a source electrode, wherein the photoelectric conversion element is combined with the TFT transferring element. The metal electrode serves as a common electrode with the drain electrode; and the gate electrode is formed in such a manner that the gate electrode surrounds the common electrode. Further, the source electrode is similarly formed so that it surrounds the gate electrode.

In summary, an advantage of this invention is that a downsized image sensor can be realized without lowering the charge transfer speed of the TFT. The TFT-combined photoelectric conversion elements each include a gate electrode of the TFT formed in such a manner that the gate electrode surrounds the common electrode. Also, the source electrode of the TFT is similarly formed in such a manner that the source electrode surrounds the gate electrode.

DESCRIPTION OF THE PREFERRED EMBODIMENT

The preferred embodiments of an image sensor in accordance with this invention will be explained referring to the accompanying drawings.

Figure 6:
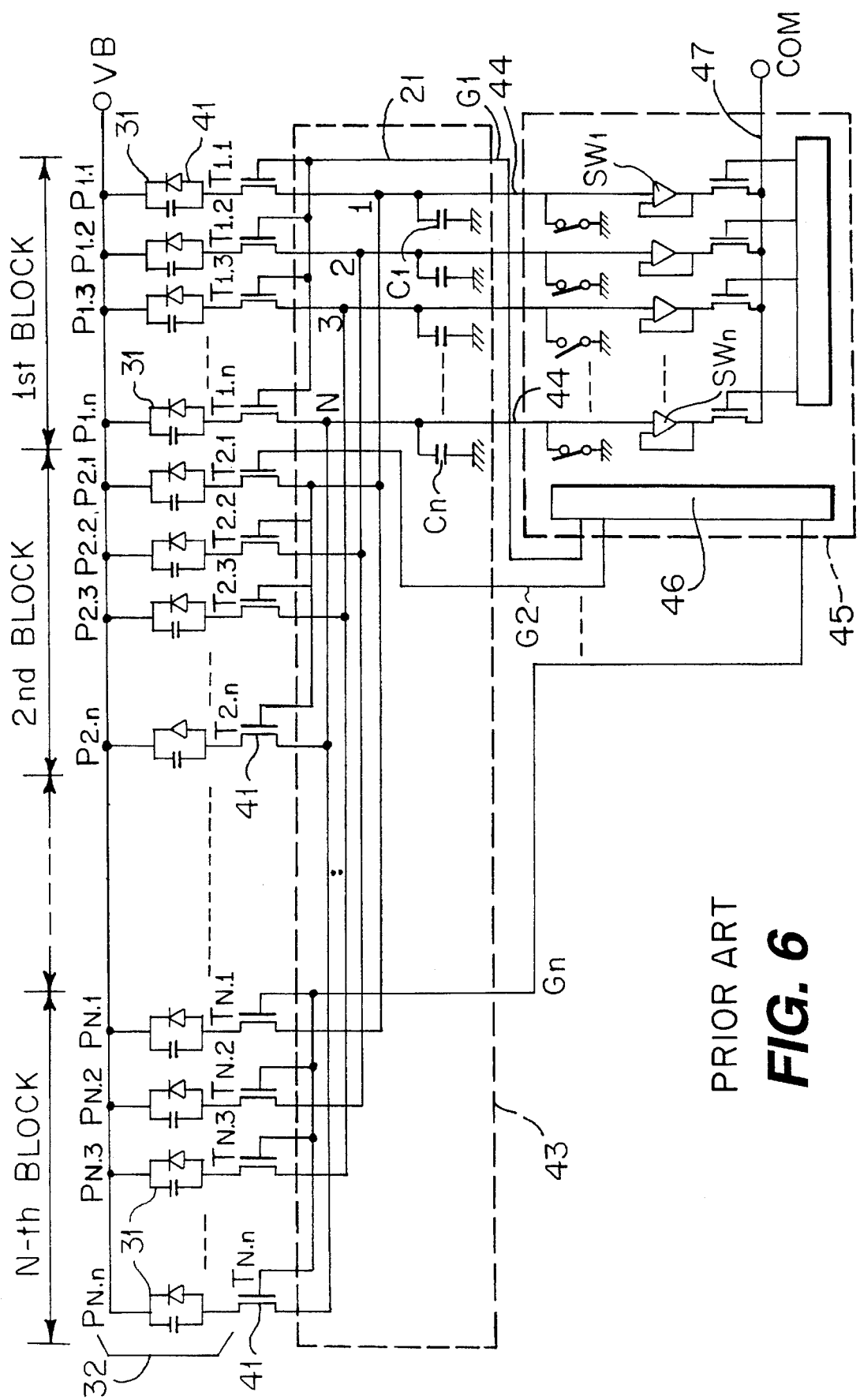
FIG. 6 is an equivalent circuit diagram of the conventional image sensor.
Figure 7:
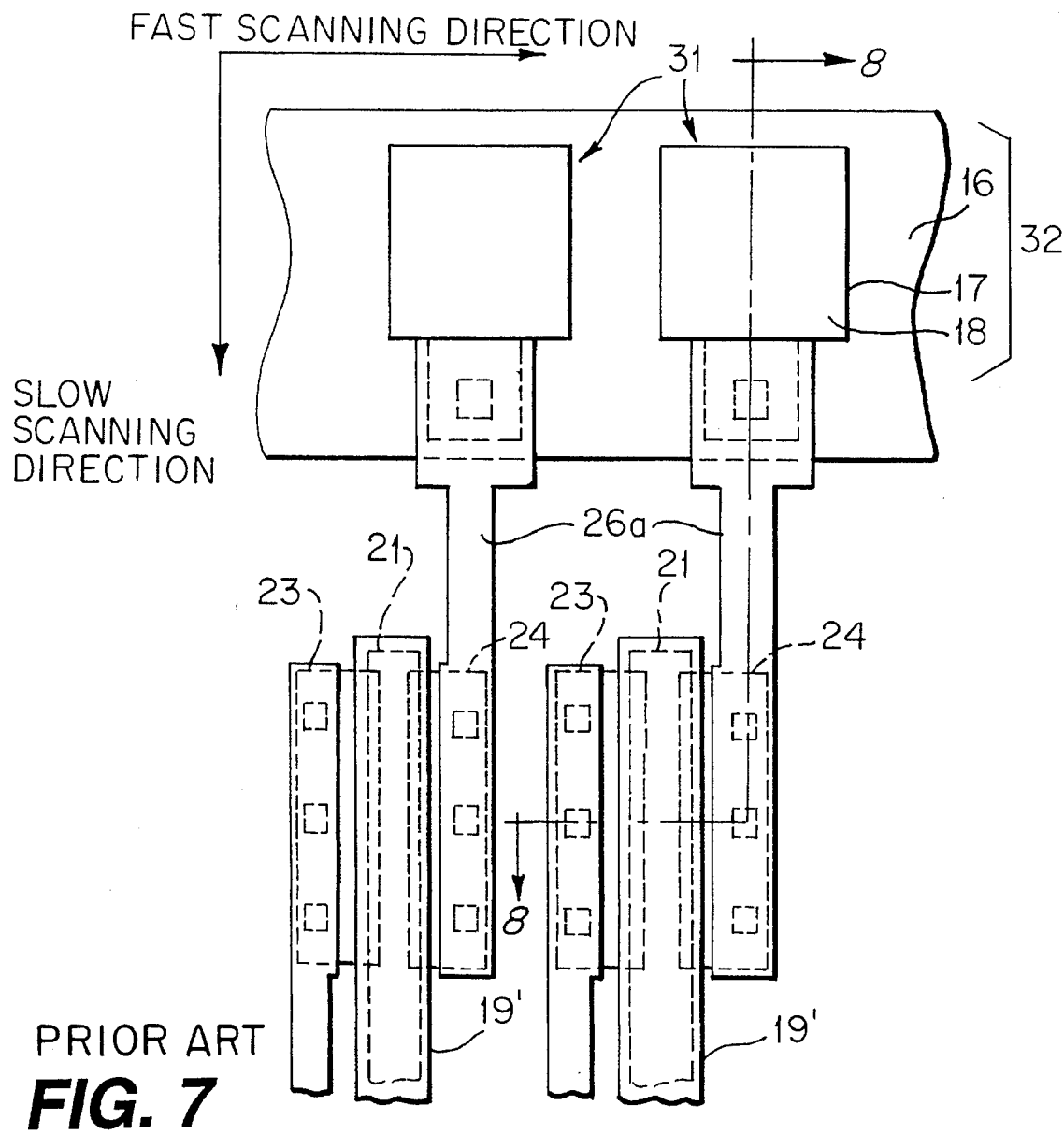
FIG. 7 is a plan view illustrating the conventional image sensor.
Figure 8:
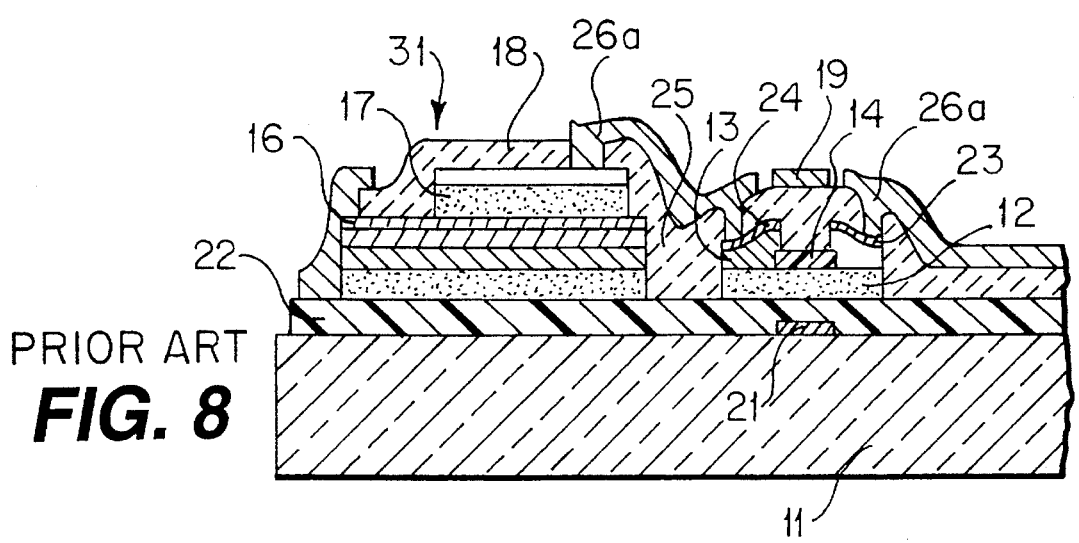
FIG. 8 is a cross-sectional view taken along line 8—8 in FIG. 7.

The equivalent circuit of the image sensor according to the first embodiment of the present invention is similar in operation to the equivalent circuit of the conventional image sensor as shown in FIG. 6.

In the preferred embodiment, each image sensor includes a photoelectric conversion element array 32 (P1,1 to PN,n) consisting of N number of blocks each including "n" number of sandwich type or laminated photoelectric conversion elements 31 disposed on an insulating substrate made of glass, for example. The image sensor further comprises a charge transfer section 41 composed of thin-film transistor transferring elements (TFTs) T1,1 to TN,n each connected to corresponding photoelectric conversion elements 31. TFTs T1,1 to TN,n are also connected to matrix-formed wiring section 43, "n" number of common signal lines 44, which lead from the charge transfer section 41 through wiring section 43 and correspond to "n" number of photoelectric conversion elements in each block. Analog switches SWi (i=1 to n) are mounted in a drive IC 45 and are connected to the common signal lines 44.

Figure 1:
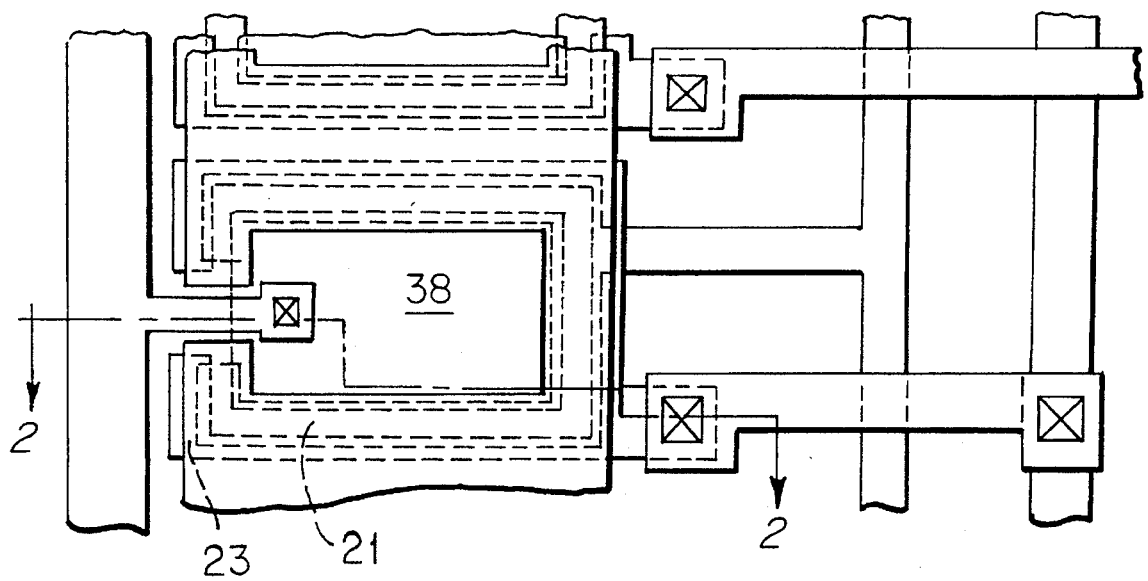
FIG. 1 is a plan view of one embodiment of a downsized image sensor in accordance with the present invention.
Figure 2:
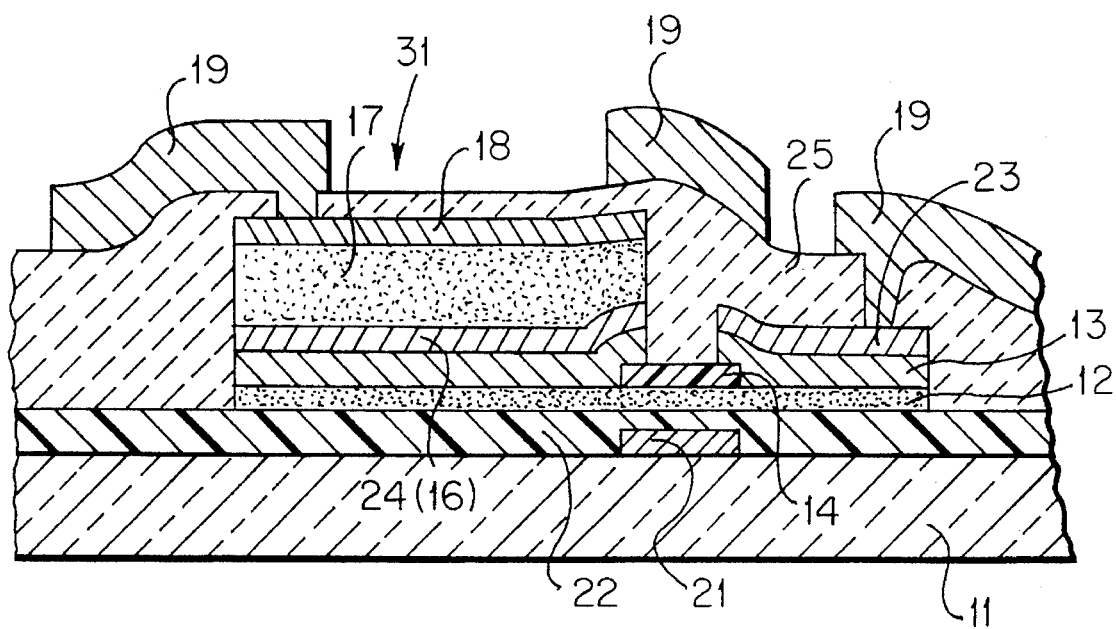
FIG. 2 is a cross-sectional view taken along line 2—2 in FIG. 1.

FIG. 1 shows a plan view illustrating a photoelectric conversion element and a TFT in a photosensing element according to the first embodiment of the present invention. The photosensing element comprises the photoelectric conversion element combined with the TFT in an integrated form (TFT-combined photoelectric conversion element). FIG. 2 shows a cross-sectional view taken along line 2—2 in FIG. 1.

The construction of the TFT of the TFT-combined photoelectric conversion element according to the first embodiment will be described with reference to FIG. 2. The TFT comprises a TFT gate electrode 21 having gate length (L) of 10 μm and gate width (W) of approximately 180 μm. Gate electrode 21 is formed on insulating substrate 11 made of glass or the like so that the gate electrode surrounds the photoelectric conversion element. The inside portion of gate electrode 21 underlies a portion of metal electrode 16 which is formed in a subsequent processing step. Gate insulating film 22 made of silicon nitride, for example, covers gate electrode 21. Semiconductor active layer 12 made of amorphous silicon hydride is formed on gate insulating film 22. Channel protector 14 made of silicon nitride or the like is formed on semiconductor active layer 12 in the same shape as gate electrode 21, thereby directly overlying the gate electrode in a face to face orientation. Ohmic contact layer 13 of n+ amorphous silicon hydride or the like, underlies chromium source and drain electrodes 23 and 24, respectively. Drain electrode 24 also serves as metal electrode 16 of the photoelectric conversion element.

On the other hand, the construction of the photoelectric conversion element of the TFT-combined photoelectric conversion element is as follows. The photoelectric conversion element comprises a metal electrode 16 which is common or shared with drain electrode 24 of the TFT. Photoconductive layer 17 includes a p-type a-Si:H layer, an intrinsic a-Si:H layer, and an n-type a-Si:H layer, which have been successively laminated on metal electrode 16. Transparent electrode 18 made of indium tin oxide (ITO), formed on photoconductive layer 17, serves as a common bias electrode for the photoelectric conversion elements.

The resulting TFT-combined photoelectric conversion element is coated with patterned insulation layer 25 made of polyimid or the like and a patterned light-shielding metal layer 19 is disposed on insulation layer 25, which specifies a photosensitive area 38 of the TFT-combined photoelectric conversion element.

Description will now be made of a fabrication process for making the image sensor according to the first embodiment. First, a lower chromium (Cr1) layer, serving as gate electrode 21, is deposited on insulating substrate 11 made of glass or the like. Prior to the deposition, insulating substrate 11 is inspected and washed in a liquid mixture of ammonia and aqueous hydrogen peroxide. Chromium is then deposited to a thickness of 500 Å to 1000 Å by a DC sputtering method. The Cr1 layer is patterned by photolithography followed by etching in a liquid mixture of ammonium cerium nitrate, perchloric acid, and water.

The resultant substrate is subjected to a BHF process and alkali cleaning. Subsequently, a silicon nitride (a-SiNx) layer is deposited to a thickness of 2000 Å to 4000 Å to form gate insulating film 22 of the TFT over patterned gate electrode 21 by plasma CVD. The deposition is performed under vacuum. In a similar manner, an amorphous silicon hydride (a-Si:H) film is deposited to a thickness of 300 Å to 1000 Å to form semiconductor active layer 12 thereon. A silicon nitride (SiNx) layer having a thickness of 4000 Å is then formed as channel protecting layer 14. The upper surface of the SiNx layer is then coated with photoresist. To yield a resist pattern, the substrate is exposed to light twice. First, the rear or back side of the substrate is exposed to light. In this step, the Cr1 layer itself serves as a mask. Secondly, the opposite side of the substrate is exposed to light through an appropriate mask above the SiNx layer. Portions of the resist, which have never been exposed, remain after development to form a resist pattern. Then, the substrate is subjected to a wet etching process, such as BHF, to pattern the SiNx layer.

On the resulting structure, an n+ a-Si:H ohmic contact layer 13 is deposited to a thickness of 1000 Å to 2000 Å by plasma CVD in $SiH_4$ gas containing $PH_3$ of 1%.

Next, chromium layer (Cr2) is deposited to a thickness of 1000 Å to 2000 Å at room temperature by DC magnetron sputtering to form source electrode 23 of the TFT and the common electrode, which serves as a drain electrode 24 of the TFT and a metal electrode 16 of the photoelectric conversion element. Photoconductive layer 17 of the photoelectric conversion element 31 is made by a plasma CVD process. A p-type a-Si:H layer is deposited to a thickness of 200 Å to 500 Å in a gas mixture of $SiH_4$ and $B_2H_6$. An intrinsic a-Si:H layer is deposited to a thickness of 1000 Å to 1500 Å in $SiH_4$ gas. An n-type a-Si:H layer is deposited to a thickness of 200 Å to 500 Å in a gas mixture of $SiH_4$ and $PH_3$. Also, an ITO layer is deposited to a thickness of 500 Å to 1000 Å by a DC magnetron sputtering method to form transparent electrode 18 of the photoelectric conversion element 31. Preferably, each deposition should follow an alkali cleaning process.

The ITO layer is patterned by a photolithography process followed by an etching process in a liquid mixture of ferric chloride and hydrochloric acid to yield transparent electrode 18 of the photoelectric conversion element 31. With the same resist pattern, a-Si:H layer 17 is then patterned by a dry-etching process in a gas mixture of $CF_4$ and $O_2$.

A photoresist layer is disposed on chromium layer Cr2. The photoresist layer is then exposed and developed to yield a masking pattern of source electrode 23 and electrode 16 of the photoelectric conversion element (which also serves as drain electrode 24 of the TFT). Chromium layer Cr2 is then patterned by etching in a liquid mixture of ammonium cerium nitrate, perchloric acid, and water. The resist layer also contains patterns for layers 12 and 13. Therefore, with the same resist pattern, n+ a-Si:H layer ohmic contact layer 13 and the a-Si:H semiconductor active layer 12 are successively patterned by appropriate etching processes. After removal of the resist, the gate insulating film 22 is subjected to a dry-etching process in a gas mixture of $CF_4$ and $O_2$.

A polyimid layer is then coated to a thickness of 1 μm to 1.5 μm over the structure, and subjected to photolithography and etching to form insulation layer 25. Subsequently, an aluminum layer is deposited thereon to a thickness of 1 μm to 2 μm by a DC magnetron sputtering method. The aluminum layer is then subjected to photolithography and etching in a liquid mixture of fluorine, nitric and phosphoric acids, and water to yield a specified pattern.

Finally, another polyimid layer, serving as a passivation layer, is coated thereon to a thickness of 2 μm to 4 μm, and subjected to pre-baking, patterning by photolithography and an etching processes, and then baking. Then, drive IC 45 and other ICs are mounted, wire-bonded, and assembled, hence completing the image sensor of this embodiment.

The operation of the resulting image sensor of the first embodiment will be outlined with reference to the equivalent circuit of FIG. 6.

A reverse bias voltage is applied to transparent electrode 18 of the TFT-combined photoelectric conversion element 31. Electric charges are generated therein in response to incoming light and stored in the photoelectric conversion element, which itself serves as a capacitor due to its structure. The TFTs remain OFF during this period of time. To enable the picture elements to be read out in any given block, a pulse is applied to the gates of the TFTs in the given block to cause the TFTs to turn ON. The electric charges are transferred to line capacitances Ci (i=1 to n) in common signal lines 44. Subsequently, the TFTs are turned OFF and analog switches SWi (i=1 to n) are sequentially turned ON to introduce each electric potential of the common signal lines 44 in the form of electric signals onto output line 47.

A feature of the TFT-combined electric conversion element 31 in the image sensor of the first embodiment is that the photoelectric conversion element is combined with the TFT in an integrated form, as shown in FIGS. 1 and 2. That is, gate electrode 21 and source electrode 23 of the TFT are disposed in such a manner that both surround the photosensitive area of the photoelectric conversion element. Further, drain electrode 24 of the TFT is formed within the photoelectric conversion element so that it can also serve also as individual electrode 16 of the photoelectric conversion element.

One advantage of the image sensor is that a sufficient gate width (W) is attained by forming gate electrode 21 of the TFT in such a manner that the gate electrode 21 surrounds the photosensitive area 38. The photoelectric conversion element and the TFT have compact structure without lowering charge mobility. In a 300 dpi and 84.7 μm picture element pitch image sensor, for example, assuming the gate length (L) of the TFT transferring element is 10 μm, a gate width (W) of 180 μm will be required to complete the electric charge transfer with a clock frequency of 4 MHz. In the image sensor of this embodiment, the sensitive area shown in FIG. 1 is 40 μm in width and 80 μm in length. The gate width (W) of 200 μm is obtained by forming the gate electrode 21 along the three sides of metal electrode 16. Consequently, the resulting elongated gate electrode not only minimizes residual image caused by incomplete electric charge transfer, but also enables the image sensor to be narrowed with respect to the slow scanning direction.

Figure 3:
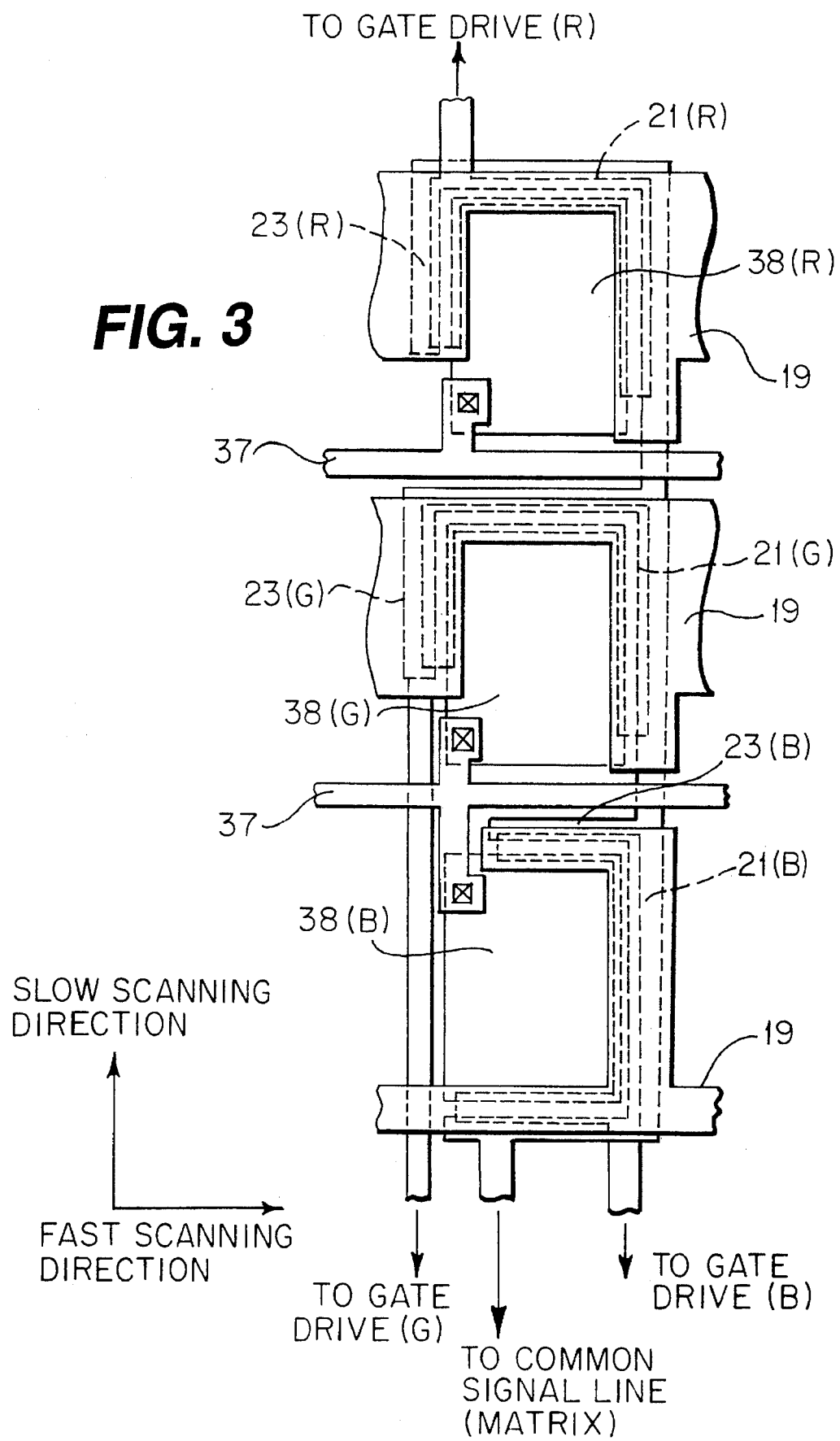
FIG. 3 is a plan view of a miniaturized image sensor according to a second embodiment of the present invention.
Figure 4:
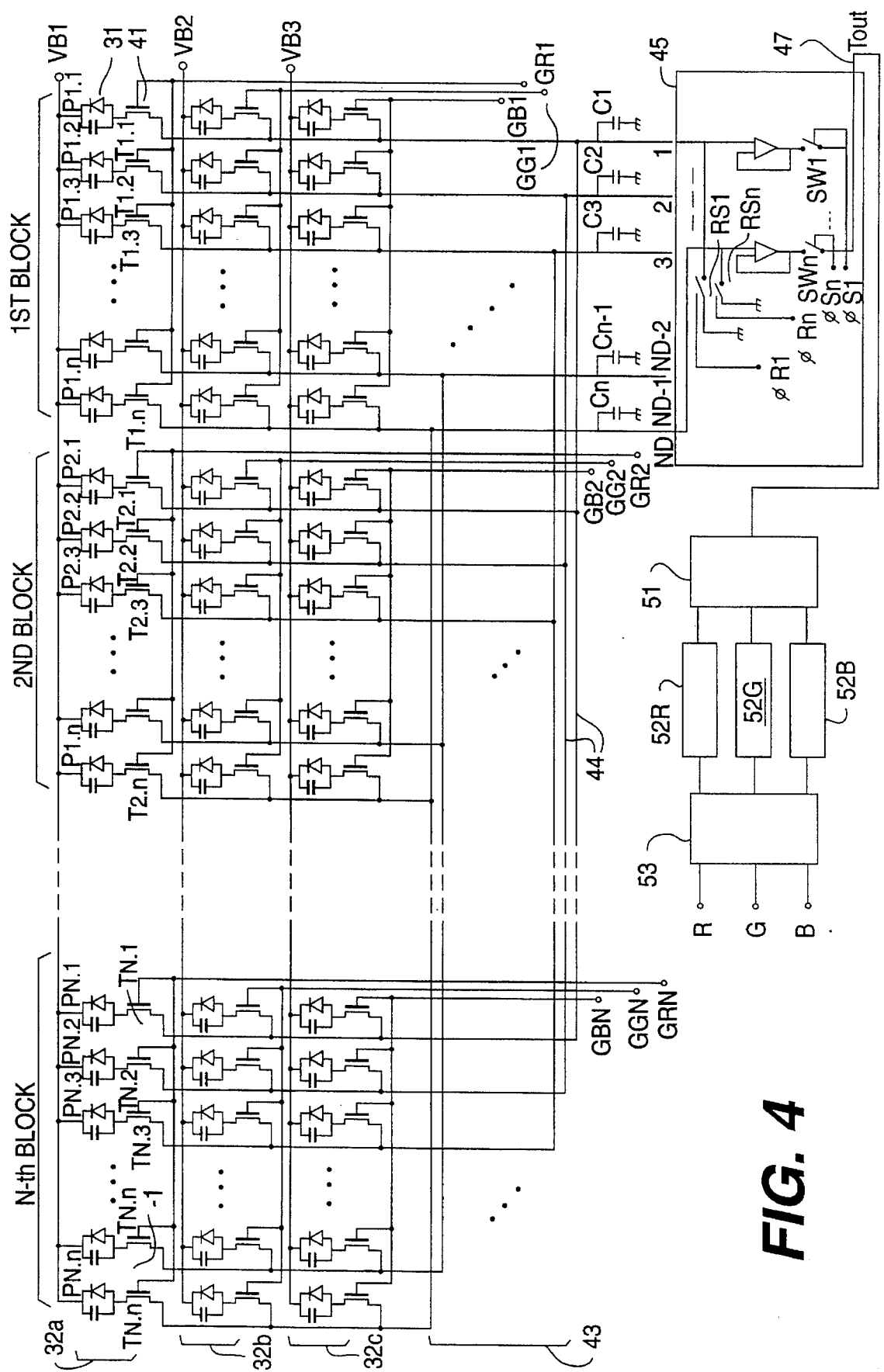
FIG. 4 is an equivalent circuit diagram of the miniaturized image sensor according to the second embodiment of the present invention.

FIG. 3 shows an application of the second embodiment, incorporating image sensors which have been narrowed in the slow scanning direction. TFT-combined photoelectric conversion elements 31 responsive to three different colors (e.g., capable of reading red, blue, and green with appropriate filters) are arranged in the slow scanning direction to form a color image sensor. The operation of the second embodiment will be explained with reference to an equivalent circuit shown in FIG. 4.

The color image sensor comprises three lines of TFT-combined photoelectric conversion element arrays 32 aligned in the slow scanning direction. Each TFT-combined photoelectric conversion element array 32 is composed of N number of blocks each including "n" number of TFT-combined photoelectric conversion elements 31 disposed on an insulating substrate made of glass or the like. Color filters (not shown) for color separation of image information cover transparent electrode 18 of the TFT-combined photoelectric conversion elements in such a way that each TFT-combined photoelectric conversion element is coupled to a color passing filter that differs from that associated with an adjacent photoelectric conversion element in the slow direction. For example, the TFT-combined photoelectric conversion element array 32a is coupled with a red (R) passing filter, array 32b is coupled with a green (G) passing filter, and array 32c is coupled with a blue (B) passing filter.

In addition, this color image sensor comprises charge transfer section 41 having TFT-combined photoelectric conversion element 31, a matrix-formed multilayered wiring section 43, "n" number of common signal lines 44 extending from charge transfer section 41 through wiring section 43 and corresponding to "n" number of the photoelectric conversion elements in each block, analog switches SWi (i=1 to n) mounted in a drive IC 45 and connected to the common signal lines 44 respectively, and line capacitances Ci (i=1 to n) of common signal lines 44.

Furthermore, output line 47 connects drive IC 45 to RGB selecting circuit 51. RGB selecting circuit 51 is connected to delay buffers 52R, 52G, and 52B as memories for red, blue and green, respectively. Delay buffers 52R, 52G, and 52B are connected to color connecting circuit 53. Color connecting circuit 53 outputs color image signals.

As seen in FIG. 3, the above-described second embodiment employs the image sensor of FIGS. 1 and 2, which are narrowed in the slow scanning direction. The metal electrode of each color picture element also serves as the "U"-shaped gate electrode 21 of each TFT-combined photoelectric conversion element 31. Each gate electrode in every block is connected to corresponding gate terminals GR1 to GRN, GG1 to GGN, and GB1 to GBN.

The above image sensor of this embodiment employs three lines of TFT-combined photoelectric conversion element arrays 32 which have a high density of photoelectric conversion elements. Accordingly, by disposing picture elements close to one another in the slow scanning direction, misregistration of colors caused by difference in reading points is reduced. Furthermore, the high density of picture elements with respect to the slow scanning direction decreases the amount of memory required in drive circuits.

Figure 5:
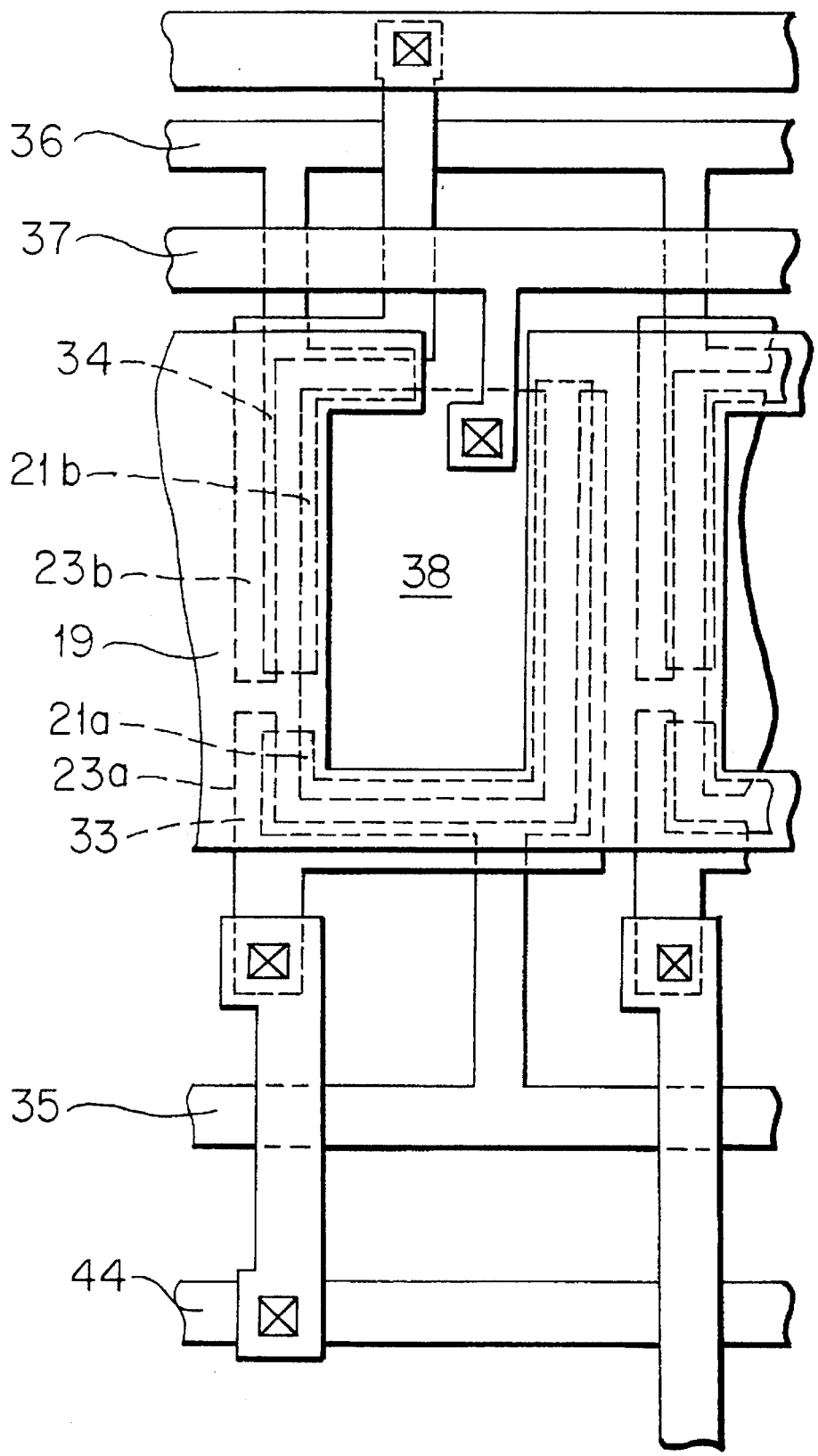
FIG. 5 is a plan view of a miniaturized image sensor of a third embodiment of the present invention.

A third embodiment of the present invention is shown in FIG. 5. In this embodiment, the "U"-shaped gate electrode 21 of the TFT shown in FIG. 1 is divided into two portions. One portion serves as transferring gate electrode 21a, and the other serves as resetting gate electrode 21b. In a similar manner, source electrode 23 is divided into two portions, one portion serves as transferring source electrode 23a, and the other portion serves as resetting source electrode 23b. Thus, a TFT resetting element and a TFT transferring element 33 are formed during the same processing steps and at the same time. The TFT resetting element not only reduces the residual image caused by incomplete charge transfer but also miniaturizes the image sensor. In FIG. 5, TFT transferring element 33 is formed on the lower right side of the photosensitive area 38, and the TFT resetting element is formed on the upper left side.

TFT resetting element 34 of the third embodiment turns ON a few clock cycles after TFT transferring element 33 turns OFF and remains ON for a period of time more than or equal to that of TFT transferring element 33. Consequently, the photoelectric conversion element is completely reset. Source electrode 23 of TFT resetting element 33 is connected to wiring which is at a fixed potential such as ground or a bias potential.

Advantages of the above photosensing element are attained especially in a color image sensor in which three color photosensing elements are arranged in the slow scanning direction. Misregistration of color is reduced and the amount of memory required by the driving circuits is also reduced.

Other advantages of this embodiment are obtained by using an insulating material and light-shielding material such as colored polyimid instead of the metallic material used in the light-shielding metal layer 19 shown in FIGS. 2, 3, 5. This insulating material, which does not require connection, simplifies layout design. Further, the entire periphery of the photosensitive area can be surrounded with the insulating material.

What is claimed is:

1. An image sensor comprising:

a substrate;

a photoelectric conversion element formed on said substrate for converting luminous energy to electric signals, said photoelectric conversion element defining a first area on a surface of said substrate underlying and being coextensive with said photoelectric conversion element; and a thin-film switching transistor formed on said substrate, said thin-film switching transistor having a control electrode formed adjacent an edge portion of said photoelectric conversion element, the control electrode for at times conducting said electric signals from said photoelectric conversion element through a gate area underlying and coextensive with said control electrode, in response to application of a voltage applied thereto, said control electrode of said thin-film switching transistor having a U-shaped configuration, said control electrode defining a second area in said surface of said substrate underlying and coextensive with said control electrode, said second area substantially surrounding said first area.

2. An image sensor according to claim 1, wherein said photoelectric conversion element includes:

a metal electrode;

a photoconductive layer overlaying said metal electrode; and a transparent electrode overlaying said photoconductive layer.

3. An image sensor according to claim 2, wherein said photoconductive layer includes amorphous silicon.

4. An image sensor according to claim 1 further comprising resetting means for resetting said photoelectric conversion element.

5. An image sensor according to claim 4 wherein said resetting means includes another thin-film transistor having a control electrode for performing said resetting in response to application of a voltage to said control electrode, said control electrode surrounding said photoelectric conversion element.

6. An image sensor according to claim 1 further comprising a gate pulse generating means connected to a gate of said thin-film switching transistor for applying a gate pulse to said thin-film switching transistor to render it conductive.

* * * * *